United States Patent
Okano (10) Patent No.: US 8,265,199 B2
(45) Date of Patent: Sep. 11, 2012

(54) RECEIVING CIRCUIT

(75) Inventor: Takashi Okano, Sakai (JP)

(73) Assignee: Daikin Industries, Ltd., Osaka (JP)

( * ) Notice: Subject to any disclaimer, the term of this patent is extended or adjusted under 35 U.S.C. 154(b) by 789 days.

(21) Appl. No.: 12/302,328

(22) PCT Filed: May 28, 2007

(86) PCT No.: PCT/JP2007/060835
§ 371 (c)(1),
(2), (4) Date: Nov. 25, 2008

(87) PCT Pub. No.: WO2007/139071
PCT Pub. Date: Dec. 6, 2007

(65) Prior Publication Data
US 2009/0285333 A1    Nov. 19, 2009

(30) Foreign Application Priority Data

May 29, 2006    (JP) .................................. 2006-148219

(51) Int. Cl.
*H04L 25/06* (2006.01)
*H04L 25/10* (2006.01)

(52) U.S. Cl. ......... 375/318; 375/330; 375/332; 375/337
(58) Field of Classification Search ................... 375/318, 375/344, 345
See application file for complete search history.

(56) References Cited

U.S. PATENT DOCUMENTS

| | | | |
|---|---|---|---|
| 5,050,190 A * | 9/1991 | Shimada et al. | 375/317 |
| 7,271,682 B1 * | 9/2007 | Blacka | 333/81 A |
| 7,894,615 B1 * | 2/2011 | McKiel, Jr. | 381/109 |
| 7,912,151 B1 * | 3/2011 | McAdam et al. | 375/318 |
| 2003/0210182 A1 * | 11/2003 | Hanson et al. | 342/175 |
| 2004/0248388 A1 * | 12/2004 | Yamazaki et al. | 438/487 |

FOREIGN PATENT DOCUMENTS

| | | |
|---|---|---|
| JP | 62-179225 A | 8/1987 |
| JP | 04-160956 A | 6/1992 |
| JP | 06-324091 A | 11/1994 |
| JP | 08-195761 A | 7/1996 |
| JP | 2001-094409 A | 4/2001 |
| JP | 2003-110410 A | 4/2003 |

* cited by examiner

Primary Examiner — David Ometz
Assistant Examiner — Qutbuddin Ghulamali
(74) Attorney, Agent, or Firm — Global IP Counselors (57) ABSTRACT

A receiving circuit includes a positive-side level judgment circuit, a negative-side level judgment circuit, and a gate circuit, and is configured to receive input of an AMI-coded signal, convert the signal to a binary output signal, and output the same. The positive-side level judgment circuit judges whether the voltage of an input signal is greater or less than a threshold on the positive side. The threshold on the positive side is provided with a hysteresis characteristic by a positive feedback. The negative-side level judgment circuit judges whether the voltage of an input signal is greater or less than a threshold on the negative side. The threshold on the negative side is provided with a hysteresis characteristic by a positive feedback loop. The gate circuit logically combines the outputs of the positive-side and negative-side level judgment circuits so as to generate the output signal.

14 Claims, 10 Drawing Sheets

RECEIVING CIRCUIT

CROSS-REFERENCE TO RELATED APPLICATIONS

This U.S. National stage application claims priority under 35 U.S.C. §119(a) to Japanese Patent Application No. 2006-148219, filed in Japan on May 29, 2006, the entire contents of which are hereby incorporated herein by reference.

TECHNICAL FIELD

The present invention relates to a receiving circuit. More specifically, the present invention relates to a receiving circuit for receiving an AMI coded signal in a transmission device in the case where a transmission path is long or has many branches such as for transmission between an outdoor unit and an indoor unit of an air conditioner.

BACKGROUND ART

A signal encoded to an alternate mark inversion (AMI) code signal (hereinafter referred to as "AMI signal") is a type of transmission signal used for transmission of digital signals. An AMI signal is used in a home bus system (HBS) and the like. An output AMI signal has three voltage levels: zero, positive, and negative, and the AMI signal flows through a positive signal line and a negative signal line. In a communication system using this signal, a logic "1" signal is set to the zero level; whereas a logic "0" signal is alternately set to positive and negative levels.

As disclosed in Japanese Patent Application Publication No. 8-195761, there is an air conditioner in which the exchange of data between an outdoor unit and an indoor unit is achieved by transmission of an AMI signal. Here, for example, the outdoor unit is equipped with a controller including a protocol controller, a transmitting circuit, a receiving circuit, and the like, and the transmitting circuit and the receiving circuit are connected to a positive signal line and a negative signal line that are extended to the indoor unit and the like. The receiving circuit receives an AMI signal from the positive signal line and the negative signal line; converts a positive pulse and a negative pulse of the signal to a low pulse (logic "0"), converts the zero level of the signal to a high pulse (logic "1"); and transmits the digital output to the protocol controller.

Figure 9:
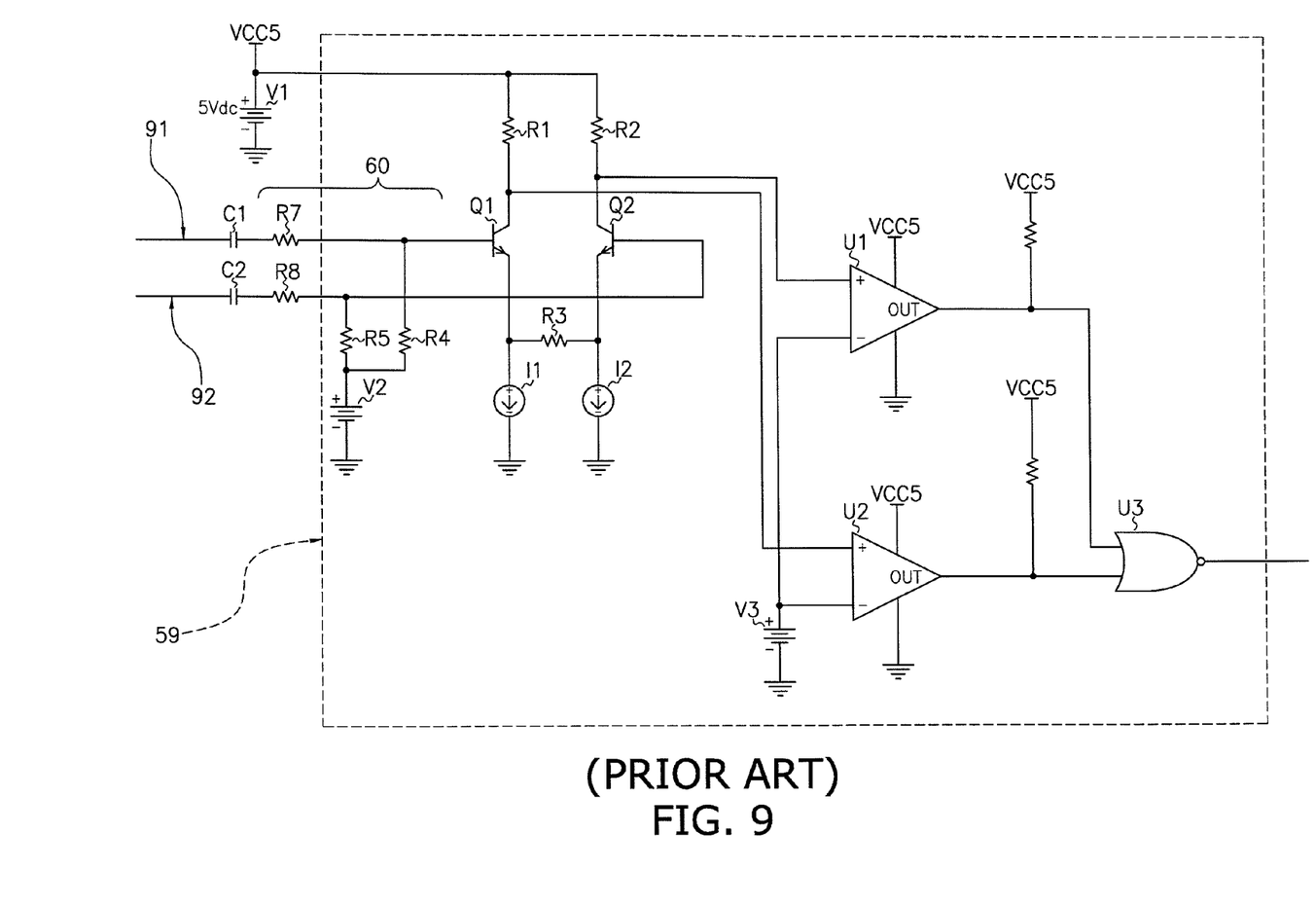
FIG. 9 is a view showing a configuration of a conventional receiving circuit.

FIG. 9 shows an example of a receiving circuit used in a current air conditioner. This receiving circuit includes: coupling condensers C1, C2; an attenuator including resistors R4, R5, R7, and R8; a differential amplification circuit constituted by transistors Q1 and Q2 and constant current sources I1 and I2; resistors R1 and R2 for receiving a current output from the transistors Q1 and Q2 and converting it to a voltage; comparators U1 and U2 configured to judge an input signal by comparing each voltage output from the resistors R1 and R2 with a reference voltage V3; a gate circuit U3 configured to invert a logical sum of each output of the comparators U1 and U2; and the like. In FIG. 9, a symbol VCC5 represents a supply voltage. The receiving circuit receives an AMI signal from a positive signal line 91 and a negative signal line 92, and transmits a binary output signal from the gate circuit U3 to the protocol controller (not shown). In addition, in the receiving circuit shown in FIG. 9, a portion surrounded by dotted lines is embedded in an integrated circuit 59.

SUMMARY OF THE INVENTION

Object to be Achieved by the Present Invention

In the communication system of an air conditioner which uses an AMI signal, a transmission path between an outdoor unit installed on the roof of a building or the like and an indoor unit installed in the ceiling of each room tends to be long. In this case, it is not only that the waveform of the signal may become distorted while the signal passes through the transmission path; but it is also that the effects of noise and reflected waves are exerted on the waveform, causing a pulse originally generated as one pulse to be divided into a plurality of pulses when the signal is converted by the receiving circuit. In addition, also in the case where the transmission path has many branches, a similar problem as described above may occur.

Figure 10:
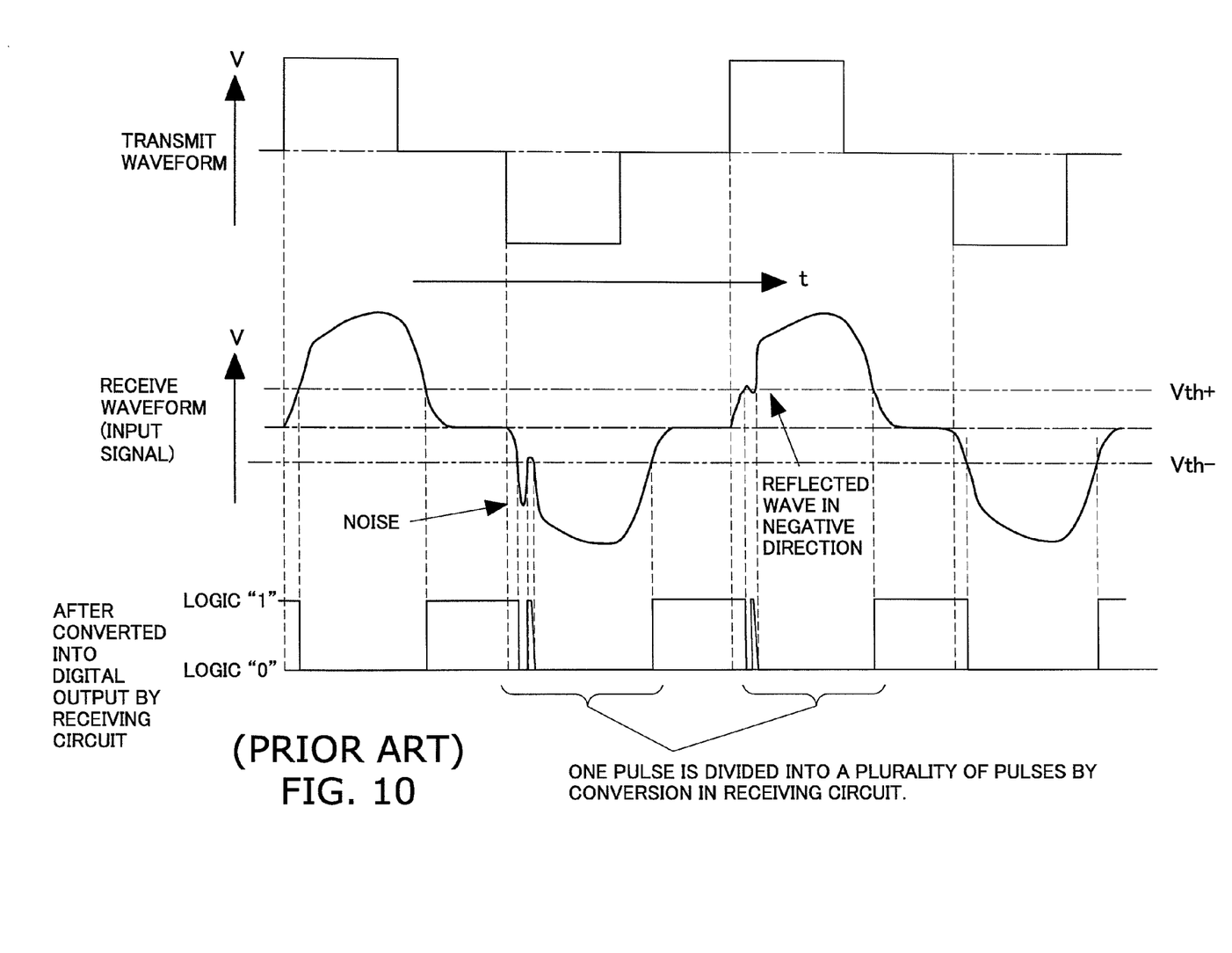
FIG. 10 is a view showing a problem in an output signal in the conventional receiving circuit.

As shown in FIG. 10, the waveform (receive waveform) of the signal at the time of input to the receiving circuit is distorted with respect to the transmit waveform and the effects of noise and reflected waves are superimposed. The receiving circuit that received a signal having such waveform converts the signal to a logic "0" digital signal and a logic "1" digital signal using a threshold voltage Vth+ on the positive side and a threshold voltage Vth− on the negative side as thresholds. Specifically, a signal in the range from the level Vth+ to the level Vth− is converted to a logic "1" level and a signal beyond the level Vth+ and below the level Vth− is converted to a logic "0" level. Therefore, in the case of the receive waveform as shown in the middle portion of FIG. 10, a pulse originally generated as one pulse is divided into and identified as a plurality of pulses due to the effects of noise and reflected waves as shown in the lower portion of FIG. 10. As a result, there is a case where the protocol controller that received the digital output signal from the receiving circuit judges that data has error, which may consequently cause communication error.

In addition, in the conventional receiving circuit shown in FIG. 9, the resistors R4 and R5 that are electronic components to determine the input sensitivity together with the resistors R7 and R8 are embedded in the integrated circuit 59. This contributes to a reduction of the number of external electronic components to the integrated circuit 59. However, recent technical investigations by the inventor of the present application are revealing that the effects of noise and reflected waves may be the factors that reduce the accuracy of data conversion in the receiving circuit.

An object of the present invention is to provide a receiving circuit capable of reducing the frequency of occurrence of communication error.

Means to Achieve the Object

A receiving circuit according to a first aspect of the present invention is a receiving circuit that receives input of an AMI signal, converts the signal to a binary output signal, and outputs the same, the receiving circuit including a first judging section or means, a second judging section or means, an output signal generating section or means, a first hysteresis generating section or means, and a second hysteresis generating section or means. The first judging means judges whether an input signal is greater or less than a first threshold on the positive side. The second judging means judges whether an input signal is greater or less than a second threshold on the negative side. The output signal generating means generates the output signal based on judgment results of the first judging means and the second judging means. The first hysteresis generating means provides a hysteresis characteristic to the first threshold. The second hysteresis generating means provides a hysteresis characteristic to the second threshold.

In the conventional receiving circuit as shown in FIG. 9, each of the threshold on the positive side and the threshold on the negative side is fixed as one numerical value. Thus, when an AMI signal affected by noise and reflected waves is received, a pulse originally generated as one pulse as shown in the lower portion of FIG. 10 is likely to be presented as a plurality of pulses in the output signal.

In contrast to the above, in the receiving circuit of the first aspect of the present invention, each of the first threshold on the positive side and the second threshold on the negative side is provided with a hysteresis characteristic. Consequently, the response of each judging means to a disturbed portion of the AMI signal affected by noise and reflected waves becomes less sensitive, which reduces the occurrence of the problem that an original pulse is divided into a plurality of pulses in the output signal due to noise and the like. In this way, the receiving circuit according to the first aspect of the present invention can reduce the frequency of occurrence of communication error, compared with the conventional receiving circuit.

A receiving circuit according to a second aspect of the present invention is the receiving circuit according to the first aspect of the present invention, wherein the first hysteresis generating means sets the first threshold to a first threshold for increase on the positive side and a first threshold for decrease on the positive side by providing a hysteresis characteristic. The first judging means inverts the result of judgment between the two levels when the voltage of the input signal exceeds the first threshold for increase on the positive side during the increase of the voltage of the input signal. Further, the first judging means inverts the result of judgment between the two levels when the voltage of the input signal lowers the first threshold for decrease on the positive side during the decrease of the voltage of the input signal. In addition, the second hysteresis generating means sets the second threshold to a second threshold for increase on the negative side and a second threshold for decrease on the negative side by providing a hysteresis characteristic. The second judging means inverts the result of judgment between the two levels when the voltage of the input signal exceeds the second threshold for increase on the negative side during the increase of the voltage of the input signal. Further, the second judging means inverts the result of judgment between the two levels when the voltage of the input signal lowers the second threshold for decrease on the negative side during the decrease of the voltage of the input signal.

Here, the hysteresis characteristics for reducing the effects of disturbance of the waveform due to the noise and reflected waves for judging the voltage of the input signal are provided at two points (the first threshold and the second threshold), thereby reducing the frequency of occurrence of communication error.

A receiving circuit according to a third aspect of the present invention is a receiving circuit that receives input of an AMI coded differential signal, converts the signal to a binary output signal, and outputs the same, the receiving circuit including a differential amplifying section or means, a first judging section or means, a second judging section or means, an output signal generating section or means, a first hysteresis generating section or means, and a second hysteresis generating section or means. The differential amplifying means converts the differential signal to a normal signal. Each of the first judging means and the second judging means judges whether the normal signal is greater or less than a threshold. The output signal generating means generates the output signal based on judgment results of the first judging means and the second judging means. The first hysteresis generating means provides a hysteresis characteristic to a threshold of the first judging means. The second hysteresis generating means provides a hysteresis characteristic to a threshold of the second judging means.

In the conventional receiving circuit as shown in FIG. 9, the threshold is fixed as one numerical value. Thus, when an AMI signal affected by noise and reflected waves is received, a pulse originally generated as one pulse as shown in the lower portion of FIG. 10 is likely to be presented as a plurality of pulses in the output signal.

In contrast to the above, in the receiving circuit of the third aspect of the present invention, a hysteresis characteristic is provided to the threshold in each of the first judging means and the second judging means. Consequently, the response of each judging means to a disturbed portion of the AMI signal affected by noise and reflected waves becomes less sensitive, which reduces the occurrence of the problem that an original pulse is divided into a plurality of pulses in the output signal due to noise and the like. In this way, the receiving circuit according to the third aspect of the present invention can reduce the frequency of occurrence of communication error, compared with the conventional receiving circuit.

A receiving circuit according to a fourth aspect of the present invention is a receiving circuit that receives input of an AMI-coded signal, converts the signal to a binary output signal, and outputs the same, the receiving circuit including an attenuator and a conversion unit. The attenuator includes a plurality of electronic components, and is configured to attenuate an input signal. The conversion unit converts an input signal attenuated by the attenuator to the output signal. In addition, the conversion unit is embedded in an integrated circuit. Further, the electronic components of the attenuator are arranged outside the integrated circuit.

In the conventional receiving circuit shown in FIG. 9, because of an attenuator 60 including the resistors R4, R5, R7, and R8, the voltage attenuation ratio of the input signal is determined as follows, provided that the resistance of the resistor R4 is the same as the resistance of the resistor R5 and the resistance of the resistor R7 is the same as the resistance of the resistor R8:

(resistance of resistor R4)/(resistance of resistor R4+resistance of resistor R7).

However, in the conventional receiving circuit shown in FIG. 9, the resistors R4 and R5, which are electronic components that determine the input sensitivity together with resistors R7 and R8, are embedded in the integrated circuit 59. Typically, while an ion implantation resistor, a polysilicon resistor, and the like are used inside the integrated circuit, a metal film resistor and a carbon film resistor are used as external resistors. The degree of the change in the resistance due to the ambient temperature is different between the resistors R4 and R5 in the integrated circuit 59 and the external resistors R7 and R8. Generally, a resistor in the integrated circuit has poor temperature characteristics, and an external resistor has good temperature characteristics. If the resistors R4, R5, R7, R8 had the same temperature characteristics, the attenuation ratio of the input signal would be maintained constant even when the ambient temperature varied. However, it is not the case, and the temperature characteristics of the resistors R4 and R5 in the integrated circuit are different from the temperature characteristics of the external resistors R7 and R8. Thus, the attenuation rate is affected by the temperature.

Accordingly, in the conventional receiving circuit, the input signal attenuation rate of the attenuator is affected by the temperature, which increases the sensitivity of the signal and in turn susceptibility thereof to the noise or reduces the sensitivity of the signal and in turn susceptibility thereof to a reflected wave in the negative direction.

In contrast to the above, because the receiving circuit according to the fourth aspect of the present invention has a configuration in which the electronic components such as the resistors and the like constituting the attenuator are arranged outside the integrated circuit, it is possible to maintain the attenuation rate substantially constant even when the ambient temperature varies. Thus, in the receiving circuit of the fourth aspect of the present invention, the frequency of occurrence of communication error is reduced.

A receiving circuit according to a fifth aspect of the present invention is the receiving circuit of the fourth aspect of the present invention, wherein the conversion unit has a differential amplifying section or means configured to convert the input signal from a differential signal to a normal signal, and an output signal generating portion or means configured to convert the normal signal to the output signal.

A receiving circuit according to a sixth aspect of the present invention is the receiving circuit of the fourth or fifth aspect of the present invention, wherein a power supply connected to the electronic components of the attenuator is pulled out from inside to outside the integrated circuit.

A receiving circuit according to a seventh aspect of the present invention is the receiving circuit of the fourth or fifth aspect of the present invention, wherein a power supply connected to the electronic components of the attenuator is generated inside or outside the integrated circuit.

Effects of the Present Invention

The receiving circuit according to the first and second aspects of the present invention reduces the sensitivity of the response of each judging means to a disturbed portion of the AMI signal affected by noise and reflected waves, which consequently reduces the occurrence of the problem that an original pulse is divided into a plurality of pulses in the output signal due to noise and the like and reduces the frequency of occurrence of communication error, compared with the conventional receiving circuit.

The receiving circuit according to the third aspect of the present invention reduces the sensitivity of the response of each judging means to a disturbed portion of the AMI signal affected by noise and reflected waves, which consequently reduces the occurrence of the problem that an original pulse is divided into a plurality of pulses in the output signal due to noise and the like and reduces the frequency of occurrence of communication error, compared with the conventional receiving circuit.

In the receiving circuit according to the fourth through seventh aspects of the present invention, it is possible to maintain the attenuation rate of the attenuator substantially constant even when the ambient temperature vanes.

DETAILED DESCRIPTION OF THE INVENTION

<Air Conditioner>

Figure 1:
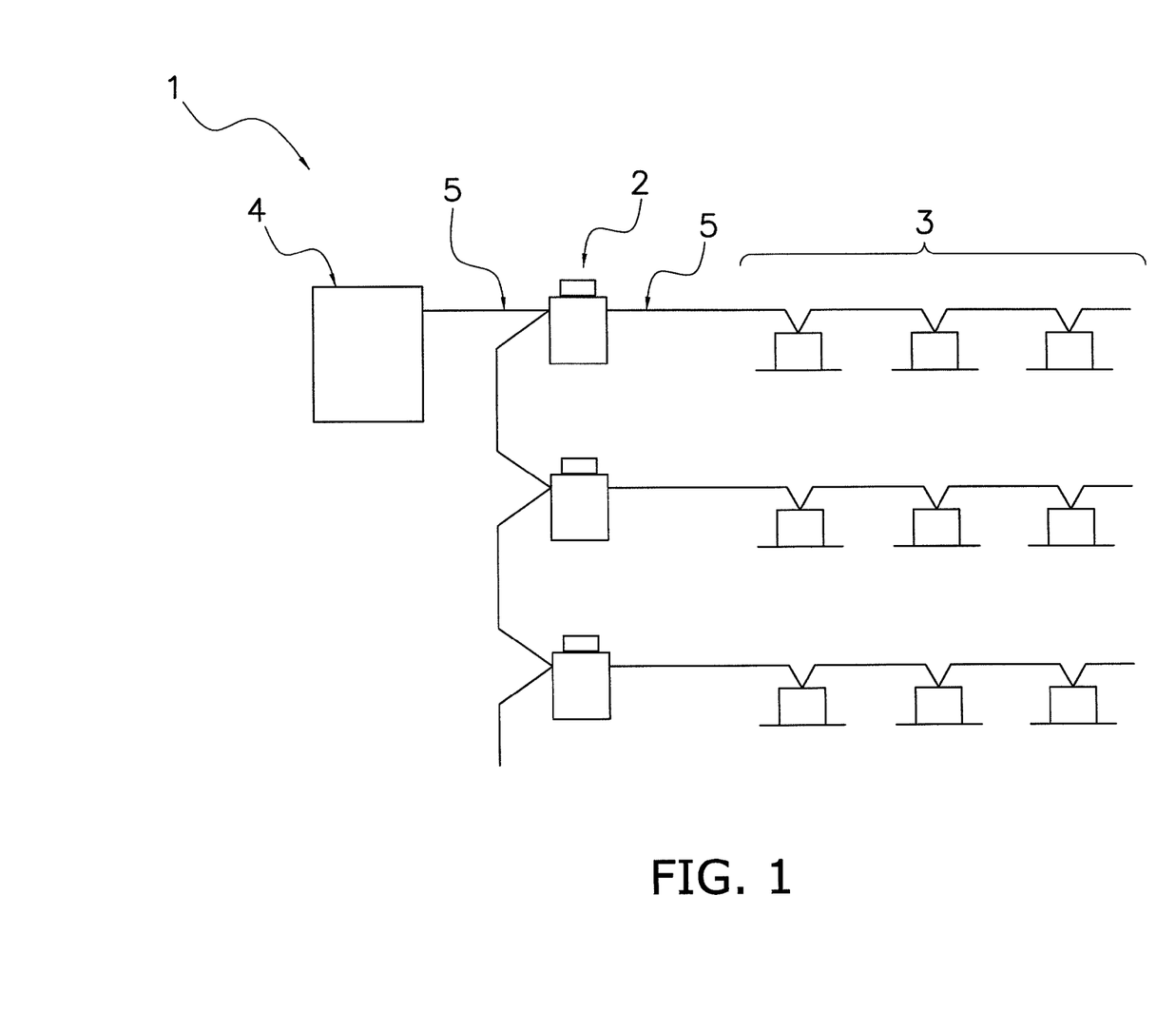
FIG. 1 is a schematic configuration diagram of an air conditioner in which a receiving circuit according to the present invention is employed.

FIG. 1 shows a schematic configuration of an air conditioner in which a transmission device including a receiving circuit according to the present invention is used. An air conditioner 1 is installed in a building such as a building and includes one or a plurality of refrigeration systems. In each refrigeration system, a closed refrigerant circuit is formed by one or a plurality of outdoor units 2 and a plurality of indoor units 3 connected to the outdoor units 2. In addition, in each refrigeration system, the outdoor units 2 and the indoor units 3 are connected by a communication line 5. When a central controller 4 is present as shown in FIG. 1, the central controller 4 is also connected by the communication line 5. The communication line 5 is provided to transmit air conditioning control data and air conditioning monitoring data, and includes a positive signal line 91 and a negative signal line 92 (see FIG. 2 and the like).

This air conditioner 1 employs a transmission system to transmit an AMI signal over the communication line 5. In this system, a signal is generated by a method in which a logic "1" signal is set to the zero level; whereas a logic "0" signal is alternately set to positive and negative levels at the time of transmission. In other words, an AMI signal has three voltage levels: zero, positive, and negative (see the upper portion of FIG. 10).

Each of the outdoor units 2, the indoor units 3, and the like connected to the communication line 5 has a transmission device equipped with a transmitting circuit, a receiving circuit, a protocol controller, and the like. The receiving circuit among these devices is described in detail below.

<First Embodiment>
<Configuration of the Receiving Circuit>

Figure 2:
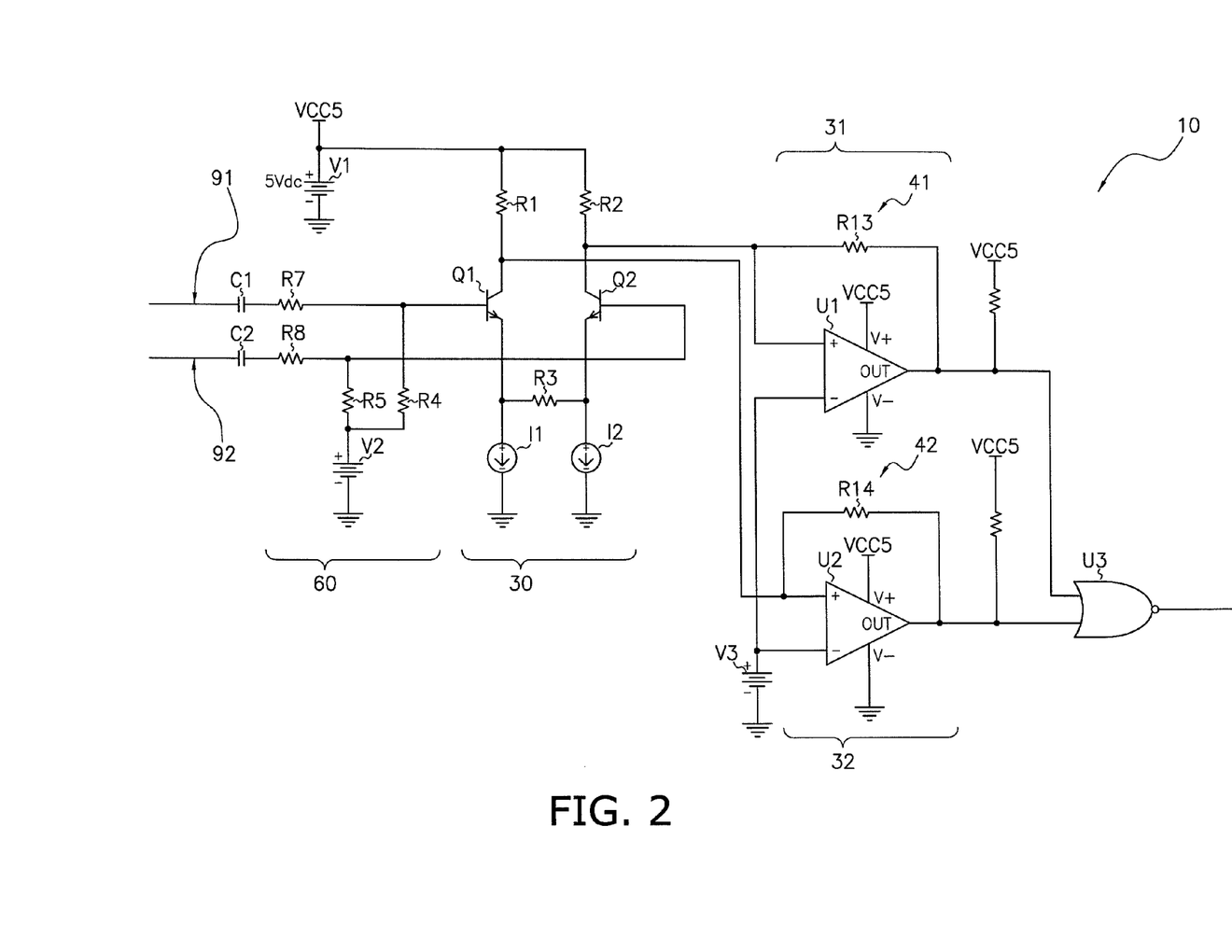
FIG. 2 is a view showing a configuration of a receiving circuit in a first embodiment.

FIG. 2 shows a receiving circuit according to a first embodiment of the present invention. A receiving circuit 10 includes coupling condensers C1 and C2, an attenuator 60, a differential amplification circuit (differential amplifying section or means) 30, a positive-side level judgment circuit 31, a negative-side level judgment circuit 32, a gate circuit (output signal generating section or means) U3, and the like.

The coupling condensers C1 and C2 block DC voltage superimposed on the communication line 5 (the positive signal line 91 and the negative signal line 92). The attenuator 60 includes resistors R4, R5, R7, and R8, and lowers the level of an input signal. The differential amplification circuit 30 includes transistors Q1 and Q2 and constant current sources I1 and I2, and converts an input signal that is a differential signal to a normal signal. The resistors R1 and R2 receive current output from the collectors of the transistors Q1 and Q2 and convert the current to voltage.

The positive-side level judgment circuit 31 includes a comparator (first judging section or means) U1, and a resistor R13 for providing a hysteresis characteristic by adding a positive feedback (first hysteresis generating section or means) 41 to the comparator U1. The comparator U1 judges the positive polarity of an input signal by comparing the voltage output from the resistor R2 with a reference voltage V3.

This comparator U1 is a comparator with hysteresis because of the positive feedback 41 including the resistor R13 inserted between the positive input and the output of the comparator. When the input signal is 0V, an output of the comparator U1 is L (low), which thus means that the resistor R2 is connected to the ground through the resistor R13 in the positive feedback. Here, a combined resistance R0 of the resistance of the resistor R2 and the resistance of the resistor R13 is determined by the following equation:

$$R0 = \frac{R2 \times R13}{R2 + R13}. \qquad \text{(Equation 1)}$$

A voltage VQ2C of the collector of the transistor Q2 is determined by the following equation:

$$VQ2C = VCC5 \times \frac{R13}{R2 + R13} - Ic \times R0. \qquad \text{(Equation 2)}$$

The symbol Ic represents a collector current of the transistor Q2. Next, when the voltage of the input signal rises, the collector current Ic of the transistor Q2 is attenuated, and the reduced amount of current flows to the transistor Q1 side. Accordingly, the Ic in the above equation is reduced, and the VQ2C is increased beyond the reference voltage V3. Then, the output of the comparator U1 is inverted, changing from L (low) to H (high). Then, one end of the resistor R13 connected to the output of the comparator U1 reaches a level of a supply voltage VCC5, and at this instance, a collector voltage VQ2C of the transistor Q2 changes according to the following equation:

$$VQ2C = VCC5 - Ic \times R0 \qquad \text{<Equation 3>}$$

The amount of voltage ΔVQ2C that changes at this instance is the difference between the above two expressions, and is determined by the following equation:

$$\Delta VQ2C = VCC5 \left( \frac{R2}{R2 + R13} \right). \qquad \text{(Equation 4)}$$

This amount of voltage ΔVQ2C provides a hysteresis characteristic. Provided that a gain by the differential amplification circuit 30 is A, hysteresis Vh is determined by the following equation:

$$Vh = A \times VCC5 \left( \frac{R2}{R2 + R13} \right). \qquad \text{(Equation 5)}$$

The negative-side level judgment circuit 32 includes a comparator (second judging section or means) U2, and a resistor R14 for providing a hysteresis characteristic by adding a positive feedback (second hysteresis generating section or means) 42 to the comparator U2. The comparator U2 judges the negative polarity of an input signal by comparing the voltage output from the resistor R1 with the reference voltage V3.

This comparator U2 is a comparator with hysteresis because of the positive feedback 42 including the resistor R14 inserted between the positive input and output of the comparator. The principle of provision of a hysteresis characteristic by the positive feedback 42 is the same as provision of a hysteresis characteristic by the above described positive feedback 41, so that the description thereof is omitted.

The gate circuit U3 is a NOR gate that inverts a logical sum of outputs of the comparators U1 and U2, and is configured to output a logic "0" or logic "1" output signal.

<Characteristics of the Receiving Circuit>

In the conventional receiving circuit as shown in FIG. 9, each of the threshold voltage Vth+ on the positive side and the threshold voltage Vth− on the negative side (see the middle portion of FIG. 10) is fixed as one numerical value. Thus, when an AMI signal affected by noise and reflected waves is received, a pulse originally generated as one pulse as shown in the lower portion of FIG. 10 is relatively likely to be presented as a plurality of pulses in the output signal.

Figure 3:
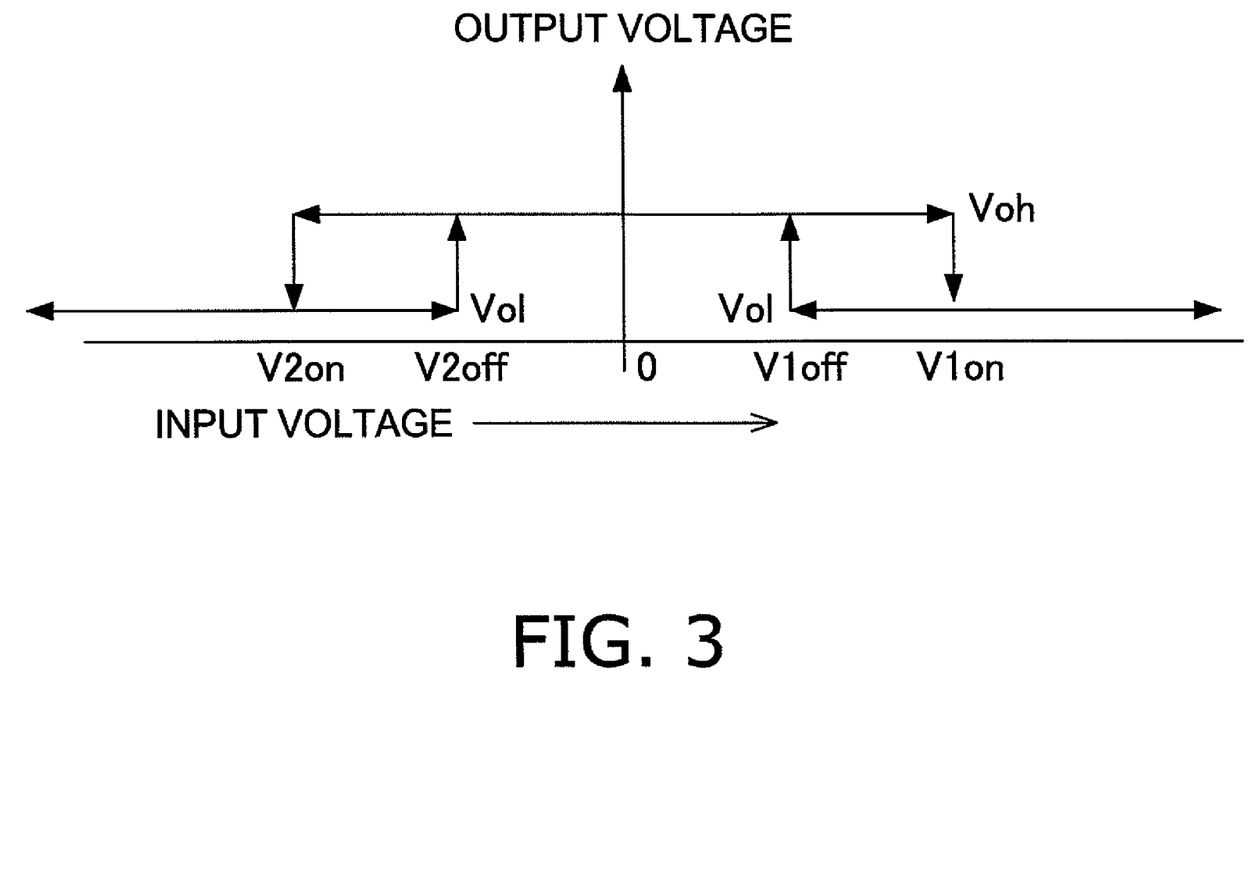
FIG. 3 is a schematic diagram showing hysteresis characteristics for threshold voltages on the positive and negative sides.

In contrast to the above, in the receiving circuit 10 of the first embodiment shown in FIG. 2, the comparators U1 and U2 are comparators with hysteresis. Thus, each of the threshold voltage on the positive side and the threshold voltage on the negative side is provided with a hysteresis characteristic. Specifically, as shown in FIG. 3, with respect to the voltage of an AMI signal input from the positive signal line 91 and the negative signal line 92 (hereinafter referred to as "input voltage"), the threshold on the positive side is divided into two thresholds V1off and V1on, and the threshold on the negative side is divided into two threshold V2off and V2on. In the case where the input voltage is positive, when the input voltage is increasing, the output voltage is inverted (changed from a high voltage Voh to a low voltage Vol) when the input voltage exceeds the threshold V1on: whereas when the input voltage is decreasing, the output voltage is inverted (changed from the low voltage Vol to the high voltage Voh) when the input voltage lowers the threshold V1off. On the other hand, in the case where the input voltage is negative, when the input voltage is increasing, the output voltage is inverted (changed from the low voltage Vol to the high voltage Voh) when the input voltage exceeds the threshold V2off: whereas when the input voltage is decreasing, the output voltage is inverted (changed from the high voltage Voh to the low voltage Vol) when the input voltage lowers the threshold V2on.

Figure 4:
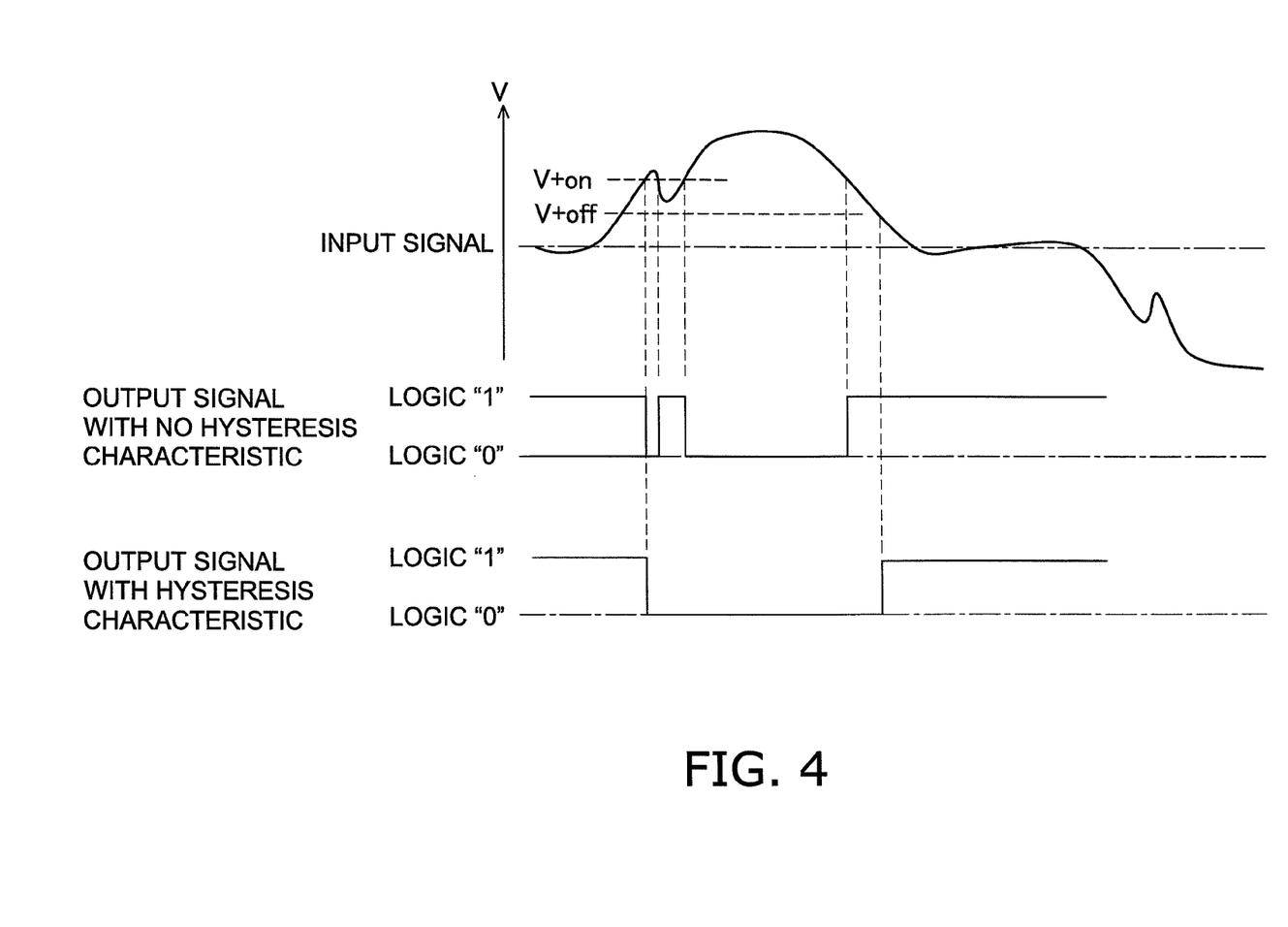
FIG. 4 is a view showing an example of an input signal and a difference in output signals due to hysteresis characteristics.

Accordingly, in the case of the receiving circuit 10 according to the first embodiment, even when an AMI signal is affected by noise and reflected waves during transmission and consequently the receive waveform of an input signal is disturbed as shown in the upper portion of FIG. 4, the occurrence of the problem that a pulse is divided into a plurality of pulses in the output signal due to the effects of noise and reflected waves is reduced (see the output signal on the lower portion of FIG. 4). By contrast, when the conventional receiving circuit in which a hysteresis characteristic is not provided from outside is used, as shown in the middle portion of FIG. 4, due to the effects of reflected waves for example, a pulse that was not originally present is mistakenly identified, generating additional pulses in the output signal.

In this way, in the receiving circuit 10, the frequency of occurrence of communication error is reduced, compared with the conventional receiving circuit as shown in FIG. 9.

<Second Embodiment>
<Configuration of the Receiving Circuit>

Figure 5:
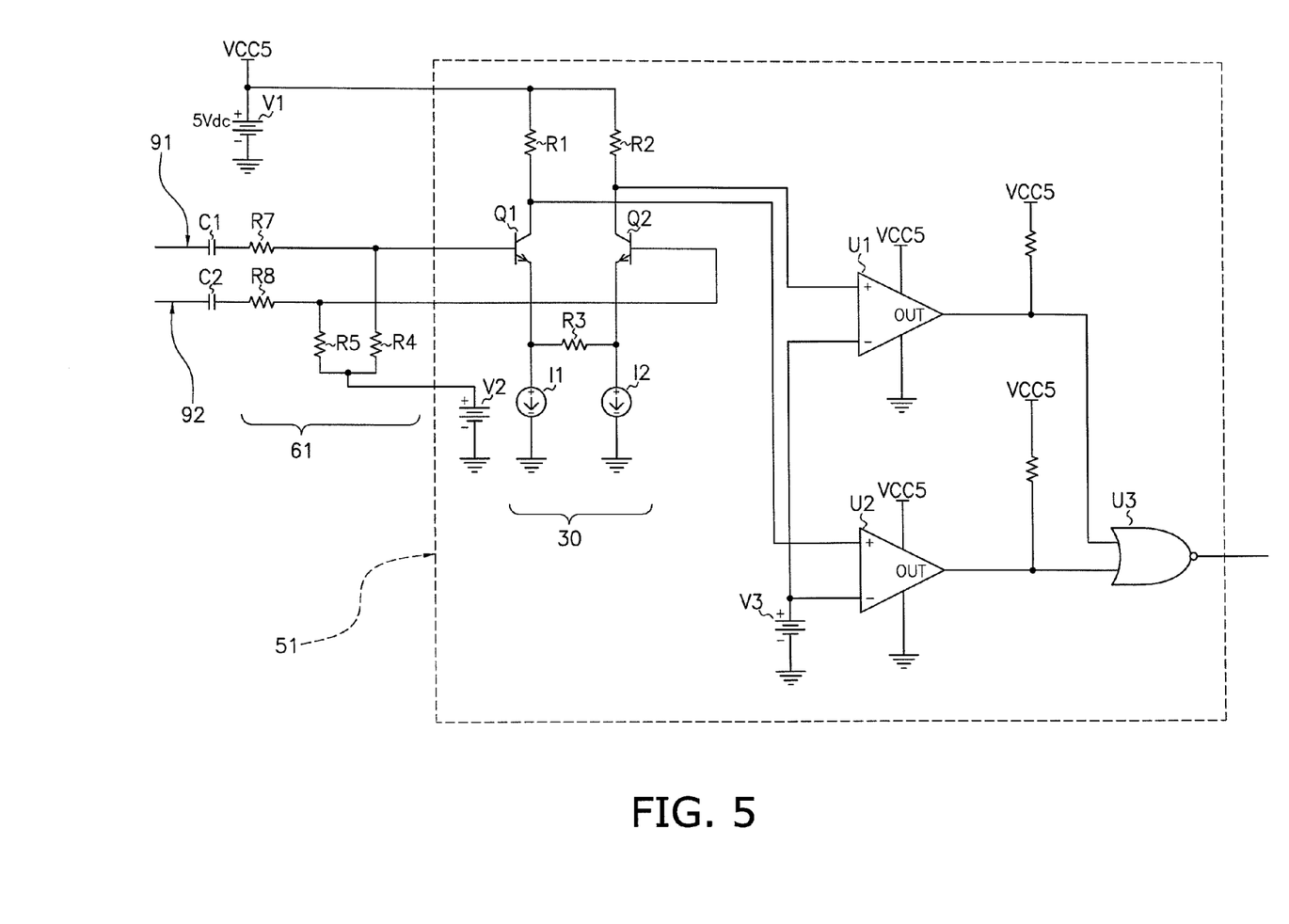
FIG. 5 is a view showing a configuration of a receiving circuit in a second embodiment.

FIG. 5 shows a receiving circuit according to a second embodiment of the present invention. This receiving circuit includes the coupling condensers C1 and C2, an attenuator 61, the differential amplification circuit 30, the comparators U1 and U2, the gate circuit U3, and the like.

The coupling condensers C1 and C2 block DC voltage superimposed on the communication line 5 (the positive signal line 91 and the negative signal line 92). The attenuator 61 includes the resistors R4, R5, R7, and R8, and lowers the level of an input signal. The differential amplification circuit 30 includes the transistors Q1 and Q2 and the constant current sources I1 and I2. The resistors R1 and R2 receive current output from the collectors of the transistors Q1 and Q2 and convert the current to voltage. The comparator U1 judges the positive polarity of an input signal by comparing the voltage output from the resistor R2 with the reference voltage V3. The comparator U2 judges the negative polarity of an input signal by comparing the voltage output from the resistor R1 with the reference voltage V3. The gate circuit U3 is a NOR gate that inverts a logical sum of outputs of the comparators U1 and U2, and is configured to output a logic "0" or logic "1" output signal. Thus, the comparator U1, the comparator U2 and the gate circuit U3 form parts of an output signal generating portion or means that is configured to convert the normal signal to the output signal.

The receiving circuit according to the second embodiment has a configuration in which all of the resistors R4, R5, R7, and R8 constituting the attenuator 61 are external resistors arranged outside the integrated circuit 51, whereas the conversion unit (such as the differential amplification circuit 30, the comparators U1 and U2, the gate circuit U3, and the like) that converts an input signal whose level is reduced by the attenuator 61 to an output signal is embedded in the integrated circuit 51.

<Characteristics of the Receiving Circuit>

In the conventional receiving circuit shown in FIG. 9, because of the attenuator 60 including the resistors R4, R5, R7, and R8, the voltage attenuation ratio of the input signal is determined as follows, provided that the resistance of the resistor R4 is the same as the resistance of the resistor R5 and the resistance of the resistor R7 is the same as the resistance of the resistor R8:

(resistance of resistor R4)/(resistance of resistor R4+resistance of resistor R7).

Therefore, an input sensitivity Vth of the entire receiving circuit is determined by the following equation, provided that the input sensitivity of the integrated circuit 59 is Vs:

$$Vth = Vs \times \frac{R4 + R7}{R4}. \quad \langle\text{Equation 6}\rangle$$

Among these, the resistors R4 and R5 are polysilicon resistors and/or ion implantation resistors having poor temperature characteristics formed in the integrated circuit 59, whereas the resistors R7 and R8 are external resistors having good temperature characteristics. In this way, in the conventional receiving circuit shown in FIG. 9, the degree of the change in the resistance due to the ambient temperature is different between the resistors R4 and R5 in the integrated circuit 59 and the external resistors R7 and R8.

Therefore, if the resistors R4, R5, R7, R8 had the same temperature characteristics, the attenuation ratio of the input signal would be maintained constant even when the ambient temperature varied. However, the temperature characteristics of the resistors R4 and R5 in the integrated circuit 59 are different from the temperature characteristics of the external resistors R7 and R8, so that the attenuation rate is affected by the temperature and the threshold levels vary. In this way, when the threshold levels vary, the communication quality is degraded.

In contrast to the above, the receiving circuit according to the second embodiment in FIG. 5 has a configuration in which all of the resistors R4, R5, R7, and R8 constituting the attenuator 61 are arranged outside the integrated circuit 51, and thus it is possible to maintain the attenuation rate substantially constant even when the ambient temperature varies. Thus, the threshold levels (absolute values of the threshold voltages Vth+ and Vth− in FIG. 10) are stably maintained. Therefore, in this receiving circuit, the communication quality is improved compared to the conventional receiving circuit.

<Third Embodiment>

Figure 6:
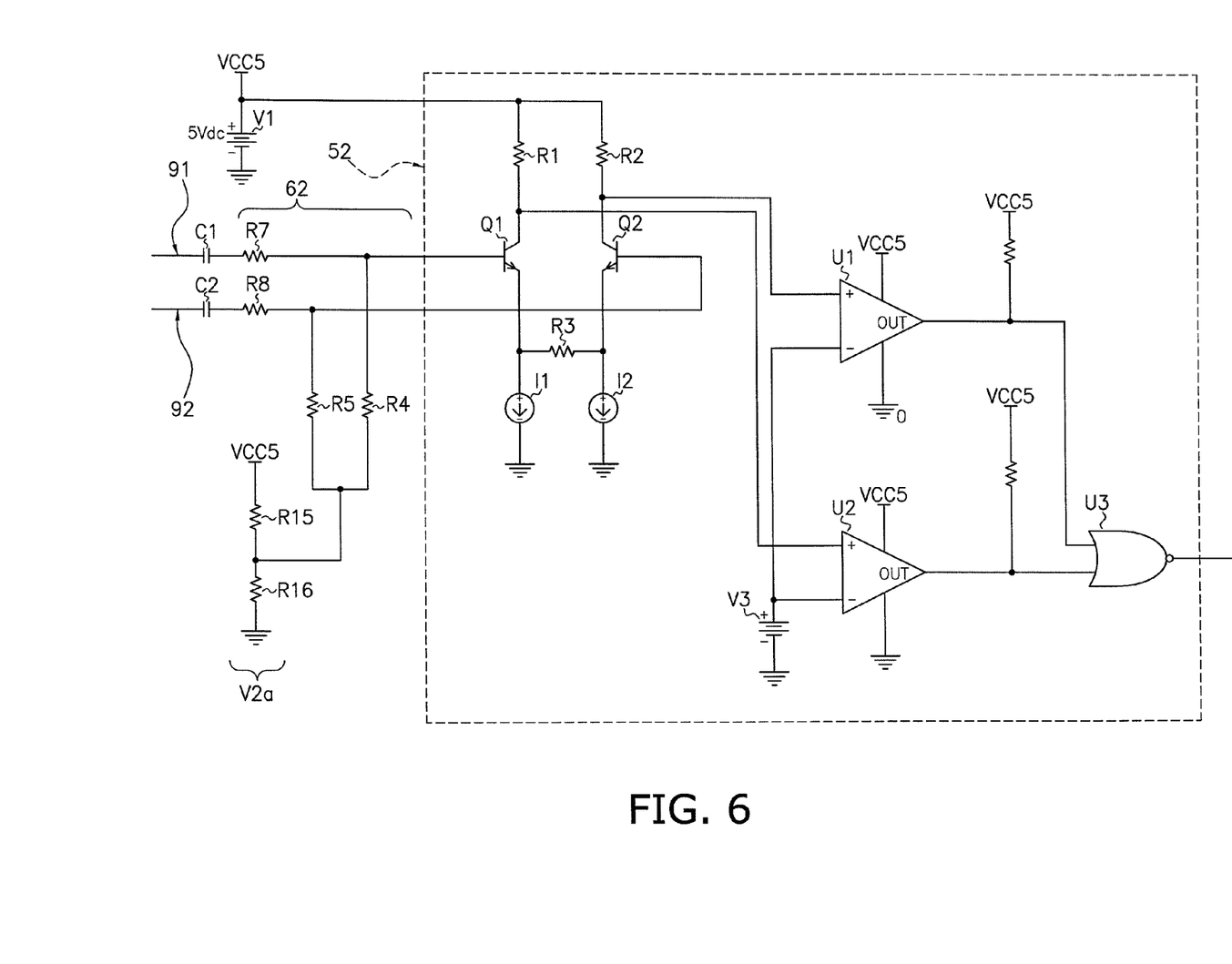
FIG. 6 is a view showing a configuration of a receiving circuit in a third embodiment.

FIG. 6 shows a receiving circuit according to a third embodiment of the present invention. This receiving circuit has basically the same configuration as the receiving circuit according to the above second embodiment except for an attenuator 62, so that only different part of the configuration is described.

In the receiving circuit according to the above second embodiment, the voltage of a voltage source V2 in the integrated circuit 51 is led out from the integrated circuit 51, and the resistors R4 and R5 are connected thereto: whereas in the receiving circuit according to the third embodiment, a voltage source V2a is generated outside the integrated circuit 52, thus reducing the number of pins extending out of the integrated circuit 52.

The configuration of the voltage source V2a outside the integrated circuit 52 in the receiving circuit of the third embodiment is not particularly limited, however, as shown in FIG. 6, for example, it may be simply configured such that the supply voltage VCC 5 is divided by resistors. In this case, the resistances of the external resistors R4, R5, R15, and R16 of the integrated circuit 52 are determined to satisfy the following two equations:

$$V2a = VCC5 \times \frac{R16}{R15 + R16}. \quad \langle\text{Equation 7}\rangle$$

$$R4 = R5 \gg \frac{R15 \times R16}{R15 + R16}. \quad \langle\text{Equation 8}\rangle$$

<Fourth Embodiment>

Figure 7:
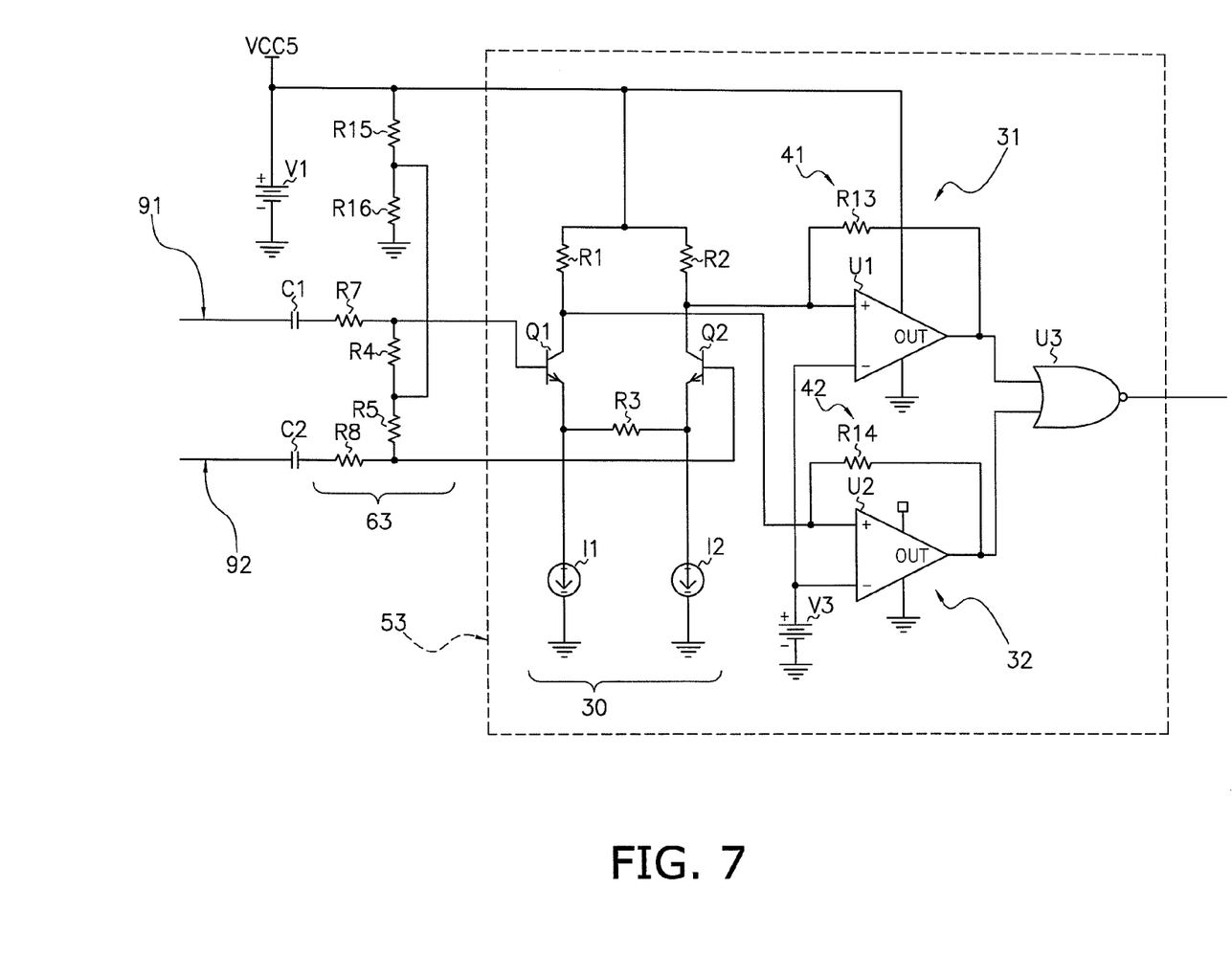
FIG. 7 is a view showing a configuration of a receiving circuit in a fourth embodiment.
Figure 8:
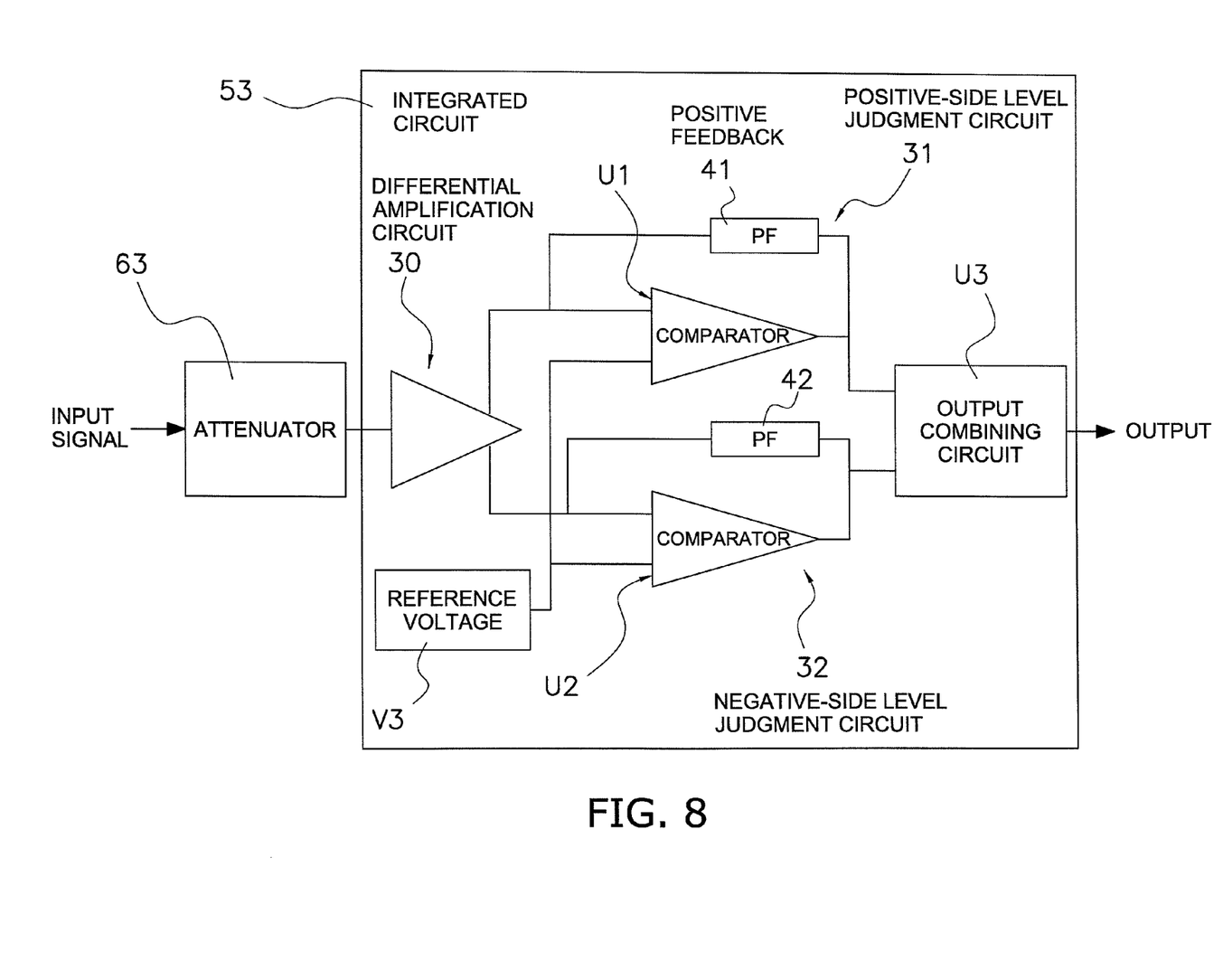
FIG. 8 is a block diagram of the receiving circuit in the fourth embodiment.

FIGS. 7 and 8 show a receiving circuit according to a fourth embodiment of the present invention. FIG. 8 shows a block diagram of the receiving circuit.

This receiving circuit is a combination of the receiving circuit according to the above first embodiment and the receiving circuit according to the above third embodiment, and includes the coupling condensers C1 and C2, an attenuator 63, the differential amplification circuit 30, the positive-side level judgment circuit 31, the negative-side level judgment circuit 32, the gate circuit U3, and the like. The attenuator 63 is the same as the attenuator 62 in the third embodiment. Other constituent elements are described in the first embodiment, so that the descriptions thereof are omitted here. The conversion unit including the differential amplification circuit 30, the positive-side level judgment circuit 31, the negative-side level judgment circuit 32, the gate circuit U3, and the like, which converts an input signal attenuated by the attenuator 63 to an output signal, is embedded in an integrated circuit 53. On the other hand, the attenuator 63 is entirely arranged outside the integrated circuit 53.

In the receiving circuit according to the fourth embodiment, the comparators U1 and U2 are comparators with hysteresis. Thus, each of the threshold voltage on the positive side and the threshold voltage on the negative side is provided with a hysteresis characteristic. Therefore, even when an AMI signal is affected by noise and reflected waves during transmission and consequently the receive waveform of the input signal is disturbed (see the upper portion of FIG. 4), the occurrence of the problem that a pulse is divided into a plurality of pulses in the output signal due to the effects of noise and reflected waves is reduced (see the output signal on the lower portion of FIG. 4).

In addition, the receiving circuit according to the fourth embodiment has a configuration in which all of the resistors constituting the attenuator 63 are arranged outside the integrated circuit 53, and thus it is possible to maintain the attenuation rate substantially constant even when the ambient temperature varies. Thus, the threshold levels (V1off, V1on, V2off, and V2on in FIG. 3) are stably maintained.

Therefore, in the receiving circuit according to the fourth embodiment, the frequency of occurrence of communication error is extremely reduced, compared with the conventional receiving circuit as shown in FIG. 9.

Note that in the receiving circuit according to the fourth embodiment, the supply voltage VCC5 is divided by resistors and the voltage source of the attenuator 63 is generated outside the integrated circuit 53. However, the receiving circuit may have a configuration in which this voltage source is generated inside the integrated circuit 53.

What is claimed is:

1. A receiving circuit that receives input of an Alternate Mark Inversion-coded signal, converts the signal to a binary output signal, and outputs the same, the receiving circuit comprising:
    a first judging section configured to judge whether an input signal is greater or less than a first threshold on a positive side of the receiving circuit;
    a second judging section configured to judge whether an input signal is greater or less than a second threshold on a negative side of the receiving circuit;
    an output signal generating section configured to generate the output signal based on judgment results of the first judging section and the second judging section;
    a first hysteresis generating section configured to provide a hysteresis characteristic to the first threshold of the first judging section, the first hysteresis generating section including a first resistor connected between a positive input and output of the first judging section; and
    a second hysteresis generating section configured to provide a hysteresis characteristic to the second threshold of the second judging section, the second hysteresis generating section including a second resistor connected between a positive input and output of the second judging section.

2. The receiving circuit according to claim 1, further comprising:
    an attenuator including a plurality of electronic components that is configured to attenuate an input signal, the electronic components including first, second, third and fourth resistors,
    the first judging section, the second judging section and the output signal generating section being embedded in an integrated circuit, and
    the first, second, third and fourth resistors of the electronic components of the attenuator being arranged outside the integrated circuit.

3. The receiving circuit according to claim 2, wherein
    first, second, third and fourth resistors have the same temperature characteristics and are configured so that the attenuation ratio of the input signal remains constant even when ambient temperature varies.

4. The receiving circuit according to claim 2, further comprising
    a differential amplifying section configured to convert the input signal from a differential signal to a normal signal,
    the output signal generating section being further configured to convert the normal signal to the output signal.

5. The receiving circuit according to claim 2, wherein
    a power supply connected to the electronic components of the attenuator is generated inside or outside the integrated circuit.

6. A receiving circuit that receives input of an Alternate Mark Inversion-coded signal, converts the signal to a binary output signal, and outputs the same, the receiving circuit comprising:
    a first judging section configured to judge whether an input signal is greater or less than a first threshold on a positive side of the receiving circuit;
    a second judging section configured to judge whether an input signal is greater or less than a second threshold on a negative side of the receiving circuit;
    an output signal generating section configured to generate the output signal based on judgment results of the first judging section and the second judging section;
    a first hysteresis generating section configured to provide a hysteresis characteristic to the first threshold;
    a second hysteresis generating section configured to provide a hysteresis characteristic to the second threshold;
    the first hysteresis generating section setting the first threshold to a first threshold for increase on the positive side and a first threshold for decrease on the positive side by providing a hysteresis characteristic;
    the first judging section inverting the result of judgment between two levels when the voltage of the input signal exceeds the first threshold for increase on the positive side during the increase of the voltage of the input signal, and inverting the result of judgment between the two levels when the voltage of the input signal lowers the first threshold for decrease on the positive side during the decrease of the voltage of the input signal;
    the second hysteresis generating section setting the second threshold to a second threshold for increase on the negative side and a second threshold for decrease on the negative side by providing a hysteresis characteristic; and
    the second judging section inverting the result of judgment between the two levels when the voltage of the input signal exceeds the second threshold for increase on the negative side during the increase of the voltage of the input signal, and inverting the result of judgment between the two levels when the voltage of the input signal lowers the second threshold for decrease on the negative side during the decrease of the voltage of the input signal.

7. The receiving circuit according to claim 6, further comprising:
    an attenuator including a plurality of electronic components that is configured to attenuate an input signal, the electronic components including first, second, third and fourth resistors, the first judging section, the second judging section and the output signal generating section being embedded in an integrated circuit, and the first, second, third and fourth resistors of the electronic components of the attenuator being arranged outside the integrated circuit.

8. The receiving circuit according to claim 7, wherein first, second, third and fourth resistors have the same temperature characteristics and are configured so that the attenuation ratio of the input signal remains constant even when ambient temperature varies.

9. The receiving circuit according to claim 7, further comprising a differential amplifying section configured to convert the input signal from a differential signal to a normal signal, the output signal generating section being further configured to convert the normal signal to the output signal.

10. The receiving circuit according to claim 7, wherein a power supply connected to the electronic components of the attenuator is generated inside or outside the integrated circuit.

11. A receiving circuit that receives input of an Alternate Mark Inversion-coded differential signal, converts the signal to a binary output signal, and outputs the same, the receiving circuit comprising:

a differential amplifying section configured to convert the differential signal to a normal signal;

a first judging section and a second judging section configured to judge whether the normal signal is greater or less than first and second thresholds of the first and second judging sections, respectively;

an output signal generating section configured to generate the output signal based on judgment results of the first judging section and the second judging section;

a first hysteresis generating section configured to provide a hysteresis characteristic to the first threshold of the first judging section, the first hysteresis generating section including a first resistor connected between a positive input and output of the first judging section; and a second hysteresis generating section configured to provide a hysteresis characteristic to the second threshold of the second judging section, the second hysteresis generating section including a second resistor connected between a positive input and output of the second judging section.

12. The receiving circuit according to claim 11, further comprising an attenuator including a plurality of electronic components that is configured to attenuate an input signal, the electronic components including first, second, third and fourth resistors, the differential amplifying section, the first judging section, the second judging section and the output signal generating section being embedded in an integrated circuit, and the first, second, third and fourth resistors of the electronic components of the attenuator being arranged outside the integrated circuit.

13. The receiving circuit according to claim 12, wherein first, second, third and fourth resistors have the same temperature characteristics and are configured so that the attenuation ratio of the input signal remains constant even when ambient temperature varies.

14. The receiving circuit according to claim 12, wherein a power supply connected to the electronic components of the attenuator is generated inside or outside the integrated circuit.

* * * * *